(12) United States Patent
Sugahara

(10) Patent No.: US 8,884,661 B2
(45) Date of Patent: Nov. 11, 2014

(54) DRIVER CIRCUIT

(71) Applicant: Fuji Electric Co., Ltd., Kawasaki (JP)

(72) Inventor: Satoshi Sugahara, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 52 days.

(21) Appl. No.: 13/767,821

(22) Filed: Feb. 14, 2013

(65) Prior Publication Data

US 2014/0055171 A1 Feb. 27, 2014

(30) Foreign Application Priority Data

Feb. 14, 2012 (JP) ................... 2012-029447

(51) Int. Cl.
*H03K 3/00* (2006.01)
*H03K 17/04* (2006.01)
(52) U.S. Cl.
CPC ...................... *H03K 17/04* (2013.01)
USPC .......................................... 327/112; 327/108
(58) Field of Classification Search
USPC .................. 327/108, 112, 109, 110
See application file for complete search history.

(56) References Cited

U.S. PATENT DOCUMENTS

| 5,736,774 A | 4/1998 | Fujihira |
| 7,969,206 B2 * | 6/2011 | Ito ................................. 327/108 |
| 2007/0085589 A1 | 4/2007 | Yoshikawa |

FOREIGN PATENT DOCUMENTS

| JP | 2002-026714 A | 1/2002 |
| JP | 2007-097348 A | 4/2007 |
| JP | 2008-098920 A | 4/2008 |
| JP | 2010-212888 A | 9/2010 |

* cited by examiner

*Primary Examiner* — Hai L Nguyen
(74) *Attorney, Agent, or Firm* — Rabin & Berdo, P.C.

(57) ABSTRACT

A driver circuit has a detector circuit including a high side detection transistor, a resistor, and a low side detection transistor connected to a high side output transistor and a low side output transistor. A clamping circuit converts a high voltage amplitude change signal generated at a connection point of the high side detection transistor and resistor to a signal clamped to a voltage range applied on the low side. An OR circuit outputs a signal taking the logical sum of an inverted control signal and an output of a low side first stage drive circuit. A level shifter circuit outputs a level-shifted signal of the OR circuit to a high side first stage drive circuit. A second OR circuit outputs a signal wherein the logical sum of an output signal of the clamping circuit and the control signal is inverted to the low side first stage drive circuit.

14 Claims, 4 Drawing Sheets

DRIVER CIRCUIT

CROSS-REFERENCE TO RELATED APPLICATION

This application claims priority under 35 U.S.C. §119 from Japanese Patent Application No. 2012-029447, filed on Feb. 14, 2012, the entirety of which is incorporated herein by reference.

BACKGROUND OF THE INVENTION

1. Technical Field

The present invention relates to a driver circuit for turning a power semiconductor device on and off.

2. Related Art

A driver circuit is necessary in order to cause a turning on and off of a power semiconductor device. The driver circuit has a pulse signal as an input, and amplifies the input as far as power needed for turning the power semiconductor device on and off.

One example of the driver circuit is shown in JP-A-2008-098920. The driver circuit of JP-A-2008-098920 includes an output buffer, formed of a high side output transistor (a p-channel field effect transistor) and a low side output transistor (an n-channel field effect transistor) that are turned on and off in a complementary way, and a dead time generator circuit for preventing the high side output transistor and low side output transistor from being turned on simultaneously.

A configuration wherein dead time is set in advance, as in the case of this driver circuit, is such that, when the output voltage of the driver circuit is set to be higher than the gate breakdown voltage of the high side output transistor and low side output transistor, a level shifter circuit for sending a gate signal to the high side output transistor is needed, and variation occurs in the transmission delay times of a high side output transistor drive signal and low side output transistor drive signal due to an action of the level shifter circuit. In order to combat this, it is necessary to secure dead time longer than the longest of the varying delay times, as a result of which, high speed switching becomes difficult. Also, as the circuit delay varies depending on the circuit configuration of the last stage of the dead time generator circuit and on operating conditions, a problem also occurs in that dead time setting is difficult.

Therefore, a circuit having a configuration wherein a turning off of the high side output transistor or low side output transistor is detected by monitoring the gate voltages thereof, the gate voltage of the high side output transistor is raised based on a downward change in the gate voltage of the low side output transistor, and the gate voltage of the low side output transistor is raised based on a downward change in the gate voltage of the high side output transistor, has been proposed (for example, refer to JP-A-2007-097348).

According to this configuration, after, for example, the high side output transistor is turned off, it is possible to swiftly cause the low side output transistor to be turned on, that is, to achieve a contraction of dead time.

However, when a turning off of the high side output transistor or low side output transistor is detected by monitoring the gate voltages thereof, as heretofore described, it is necessary to shift the levels of the transistor gate voltages.

That is, when, for example, it is detected that the high side output transistor has been turned off, it is necessary, taking the gate breakdown voltages of the high side output transistor and low side output transistor to be 5V and the amplitude of a voltage output from a series connection point of the transistors (the potential of this portion is the high side reference potential) to be 10V, to shift the gate voltage of the high side output transistor to a level appropriate to the low side circuit, and to transmit the voltage to the low side circuit.

FIG. 4 shows a heretofore known example of a level shifter circuit (for example, refer to Japanese Patent No. 3,384,399 (FIG. 5)). The level shifter circuit includes a shift down (level decreasing) circuit portion and a shift up (level increasing) circuit portion. The gate voltage of the high side output transistor output from an unshown driver circuit is input into an SOUT1 terminal of the shift down circuit portion.

The gate voltage is applied via a resistor $R_{p3}$ to a Zener diode (a p-channel field effect transistor used as a Zener diode) $Z_{p1}$, clamped by the Zener diode $Z_{p1}$, and applied to the gate of a high breakdown voltage p-channel transistor HVP. Resistors $R_{p1}$ and $R_{p2}$ are connected in series to the source and drain respectively of the transistor HVP, and a Zener diode $Z_{p2}$ is connected in parallel to the resistor $R_{p2}$. Consequently, when the transistor HVP is turned on based on the gate voltage input into the SOUT1 terminal, a shifted down signal is output from a connection point of the resistor $R_{pt}$ and the cathode of the Zener diode $Z_{p2}$. This signal is clamped by the Zener diode $Z_{p2}$.

As the shift up circuit portion has a configuration symmetrical with that of the shift down circuit portion, reference signs corresponding to components will be given, and a description of the components omitted.

When the level shifter circuit of Japanese Patent No. 3,384,399 (FIG. 5) is applied as it is to a driver circuit, the following kinds of problems occur.

A: As a large current continues to flow through the transistor HVP from a VDDHI terminal toward a VDDLC terminal during a period for which the high side output transistor of the driver circuit is in an on-state, accompanying power loss poses a problem.

B: It has been known heretofore that, when the gate voltage of the SOUT1 terminal momentarily changes to an H level due to noise or the like, and the high breakdown voltage p-channel transistor HVP is turned off, during a period for which the high side output transistor has to be in an on-state, the output of the shift down circuit portion immediately changes to an L level. In this case, as a driver circuit control circuit that receives the output signal of the shift down circuit portion mistakenly determines that the on-period of the high side output transistor has finished, there is concern that a malfunction, such as the low side output transistor being turned on and a shoot through current flowing, will occur.

SUMMARY OF THE INVENTION

Consequently, an object of the invention is to provide a driver circuit such that a reduction in power loss is achieved, and it is possible to prevent malfunction caused by noise or the like.

One aspect of the invention is a driver circuit including a serially connected high side output transistor and low side output transistor, each driven on and off based on a control input pulse signal, and outputting a signal driving a power semiconductor device from a series connection point of the transistors. The driver circuit further includes a high side first stage drive circuit, into which a first on/off signal is input, that outputs a first control signal on/off driving the high side output transistor, a low side first stage drive circuit, into which a second on/off signal is input, that outputs a second control signal on/off driving the low side output transistor.

The driver circuit further includes a detector circuit, connected in parallel to the series circuit of the high side output transistor and low side output transistor. The detector circuit includes a high side detection transistor, a resistor, and a low side detection transistor connected in series.

The driver circuit further includes a clamping circuit that converts a high voltage amplitude change signal generated at a connection point of the high side detection transistor and resistor in the detector circuit to a signal clamped to a voltage range applied on the low side.

The driver circuit further includes a first logic circuit that allows the control input pulse signal to pass through when the second control signal is a signal causing the low side output transistor to be turned off, a level shifter circuit that shifts the level of an output signal of the first logic circuit, and outputs the signal as the first on/off signal, and a second logic circuit that allows the control input pulse signal to pass through when an output signal of the clamping circuit is at an L level, outputting the control input pulse signal as a second on/off signal.

The high side detection transistor is driven on and off simultaneously with the high side output transistor by the first control signal, and the low side detection transistor is turned on when the control input pulse signal is a signal commanding a turning on of the low side output transistor or a signal commanding a turning off of the high side output transistor. The low side detection transistor is turned off when the control input pulse signal is a signal commanding a turning off of the low side output transistor or a signal commanding a turning on of the high side output transistor.

It is possible to use p-channel MOSFETs as the high side output transistor and high side detection transistor, and to use n-channel MOSFETs as the low side output transistor and low side detection transistor.

For example, a logical sum circuit that outputs a logical sum signal of an inverse signal of the control input pulse signal and the second control signal is used as the first logic circuit and, for example, a logical sum circuit that outputs an inverse signal of the logical sum of the control input pulse signal and the clamping circuit output signal is used as the second logic circuit. Furthermore, for example, a PWM signal is used as the control input pulse signal.

According to the invention, as the period for which the high side detection transistor and low side detection transistor are simultaneously in an on-state is a short time at the end of the on-period of the high side detection transistor, and there is resistance in the current paths of the high side detection transistor and low side detection transistor, power loss during the on-period of the high side detection transistor is low.

Also, even in the event that the gate voltage of the high side output transistor momentarily changes due to noise, or the like, in the on-period of the high side output transistor, there is no danger of a malfunction such as a turning on of the low side output transistor occurring.

DETAILED DESCRIPTION

Figure 1:
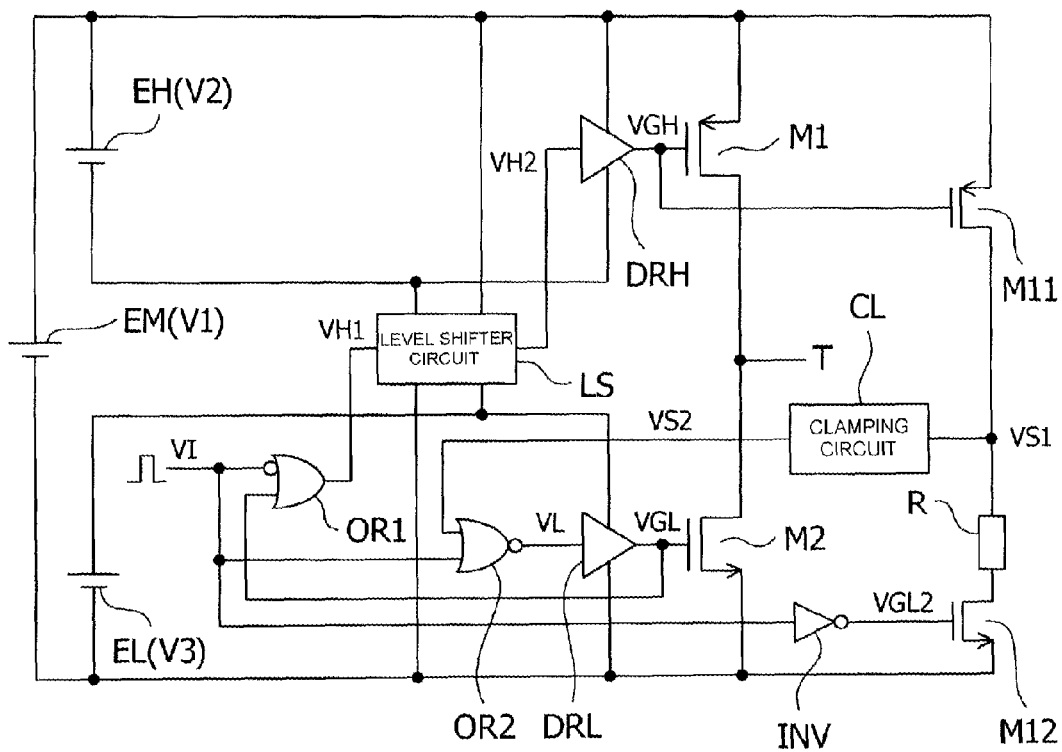
FIG. 1 is a circuit diagram showing one embodiment of a driver circuit according to the invention.

FIG. 1 shows one embodiment of a driver circuit according to the invention used for turning on and off a power semiconductor device (not shown).

The driver circuit includes a main power source EM, a high side power source EH, a low side power source EL, a high side output transistor M1, a high side first stage drive circuit DRH, a level shifter circuit LS, a low side output transistor M2, a low side first stage drive circuit DRL, a high side detection transistor M11 provided in order to detect a turning off of the high side output transistor M1, a low side detection transistor M12, also provided in order to detect a turning off of the high side output transistor M1, a resistor R, and a clamping circuit CL.

Normally, a p-channel metal oxide semiconductor field effect transistor (MOSFET) is used as the high side output transistor M1, while an n-channel MOSFET is used as the low side output transistor M2, as shown in the drawing.

Further, in the embodiment, a p-channel MOSFET is used as the high side detection transistor M11, and an n-channel MOSFET is used as the low side detection transistor M12. Transistors with a lower capacity than the output transistors M1 and M2 are used as the detection transistors M11 and M12.

The high side output transistor M1 and low side output transistor M2 are connected in series between the positive electrode and negative electrode of the main power source EM, and are driven so as to be turned on and off in a complementary way. That is, the high side output transistor M1 is such that the gate thereof is connected to an output terminal of the high side first stage drive circuit DRH, the source is connected to the positive electrode of the main power source EM, and the drain is connected to the drain of the low side output transistor M2. Meanwhile, the low side output transistor M2 is such that the gate thereof is connected to an output terminal of the low side first stage drive circuit DRL, and the source is connected to the negative electrode of the main power source EM. Further, a series connection point of the high side output transistor M1 and low side output transistor M2 is connected to an output terminal T.

The high side detection transistor M11 is such that the gate and source thereof are connected to the gate and source respectively of the high side output transistor M1, while the drain is connected via the resistor R to the drain of the low side detection transistor M12. The low side detection transistor M12 is such that the gate thereof is connected to an output terminal of an inverter INV that outputs a signal VGL2, while the source is connected to the negative electrode of the main power source EM.

The level shifter circuit LS is such that an input terminal thereof is connected to an output terminal of an OR circuit OR1, while an output terminal is connected to an input terminal of the high side first stage drive circuit DRH. The level shifter circuit LS acts so as to shift a signal level based on the potential of the negative electrode of the low side power source EL to a signal level based on the potential (V1-V2) of the negative electrode of the high side power source EH. As the configuration of the level shifter circuit LS is heretofore known, a description thereof will be omitted.

The clamping circuit CL is such that an input terminal thereof is connected to a series connection point of the high side detection transistor M11 and resistor R, while an output terminal is connected to one input terminal of an OR circuit OR2. A configuration and action of the clamping circuit CL will be described hereafter.

The OR circuit OR1 is such that one input terminal thereof is connected to the other input terminal of OR2 and an input terminal of the inverter INV, while the other input terminal is connected to the gate of the low side output transistor M2. A pulse width modulation (PWM) signal VI is input from the exterior as a control input pulse signal to the one input terminal of the OR circuit OR1. The one input terminal of the OR circuit OR1 and an output terminal of the OR circuit OR2 have negative logic. That is, the OR circuit OR1 is a circuit that outputs a signal that is a logical sum of one input signal and an inverse of another input signal, while the OR circuit OR2 is a circuit that outputs an inverse signal of the logical sum of two input signals.

An output voltage V2 of the high side power source EH is applied to the high side first stage drive circuit DRH and level shifter circuit LS, while an output voltage V3 of the low side power source EL is applied to the level shifter circuit LS, OR circuit OR1, OR circuit OR2, low side first stage drive circuit DRL, clamping circuit CL, and inverter INV. The positive electrode of the high side power source EH is connected to the positive electrode of the main power source EM, while the negative electrode of the low side power source EL is connected to the negative electrode of the main power source EM. Also, an output voltage V1 of the main power source EM is set to be higher than the output voltage V2 of the high side power source EH and the output voltage V3 of the low side power source EL.

Figure 2:
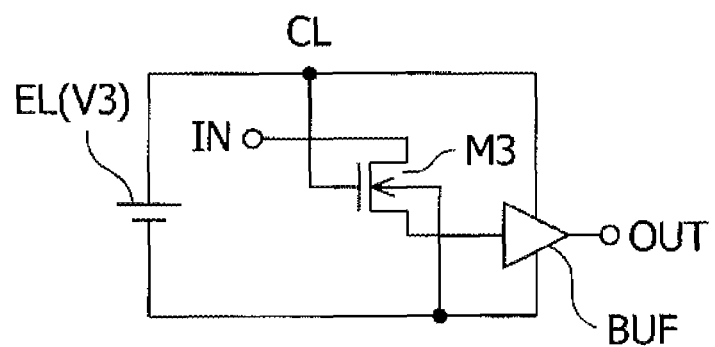
FIG. 2 is a circuit diagram showing an example of a configuration of a clamping circuit.

FIG. 2 shows an example of a configuration of the clamping circuit CL. The clamping circuit CL includes an n-channel transistor M3 and a buffer circuit (or inverter) BUF. The n-channel transistor M3, which is formed of a MOSFET, is such that the output voltage V3 of the low side power source EL shown in FIG. 1 is applied to the gate thereof, while the voltage of the connection point of the high side detection transistor M11 and resistor R (the amplitude range of this voltage is higher than that of the voltage V3) shown in FIG. 1 is applied to the drain, which forms an input terminal.

As the n-channel transistor M3 is a source follower circuit for the voltage V3 applied to the gate, a voltage clamped to V3 is output from the source of the transistor M3, and this voltage is output from an output terminal via the next stage buffer circuit BUF.

In this way, the clamping circuit CL performs an action of converting a high voltage amplitude change of the drain voltage of the high side detection transistor M11 into a signal clamped to the voltage range V3 of the low potential side.

Figure 3:
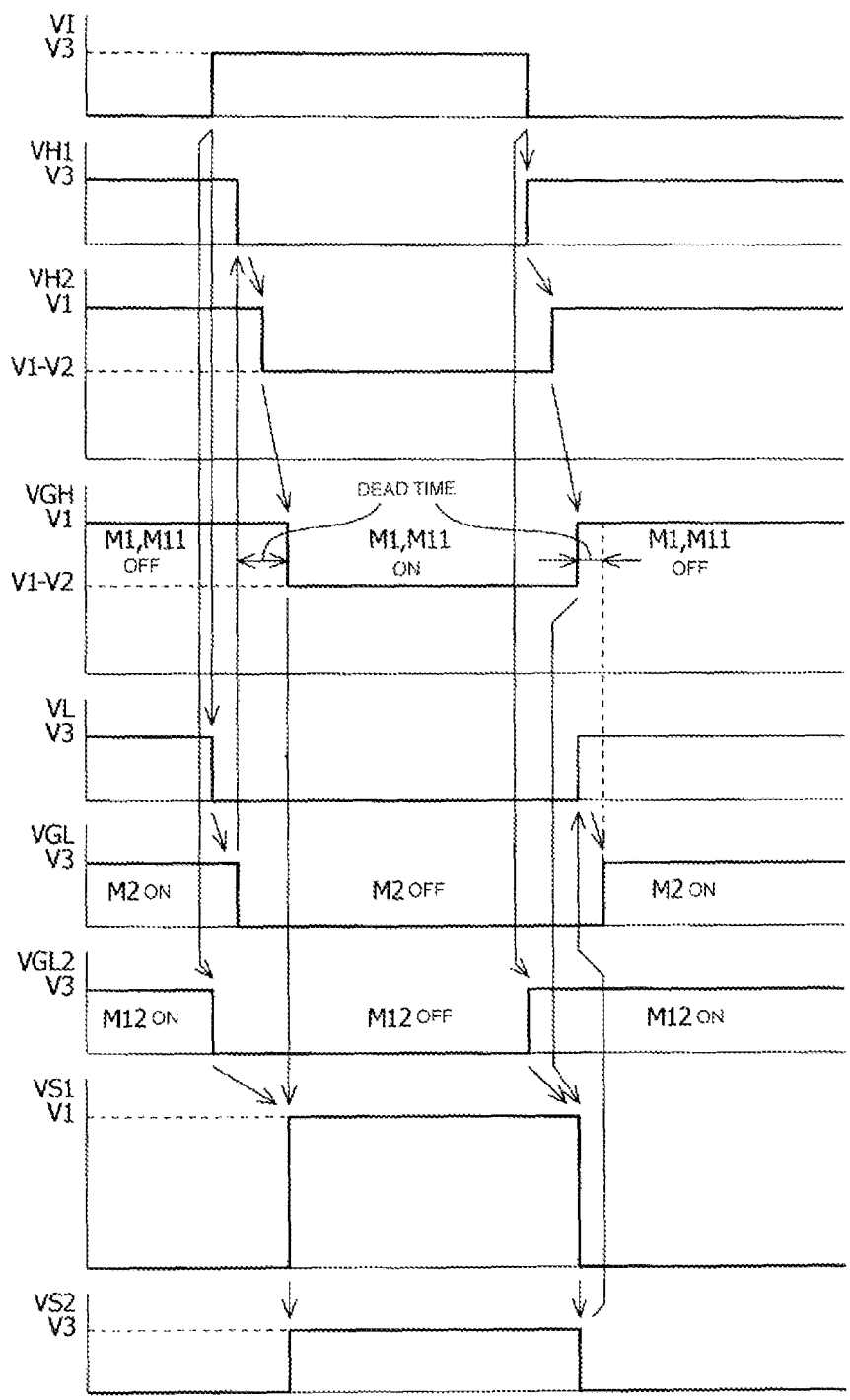
FIG. 3 is a waveform diagram for illustrating an action of the driver circuit according to the invention.
Figure 4:
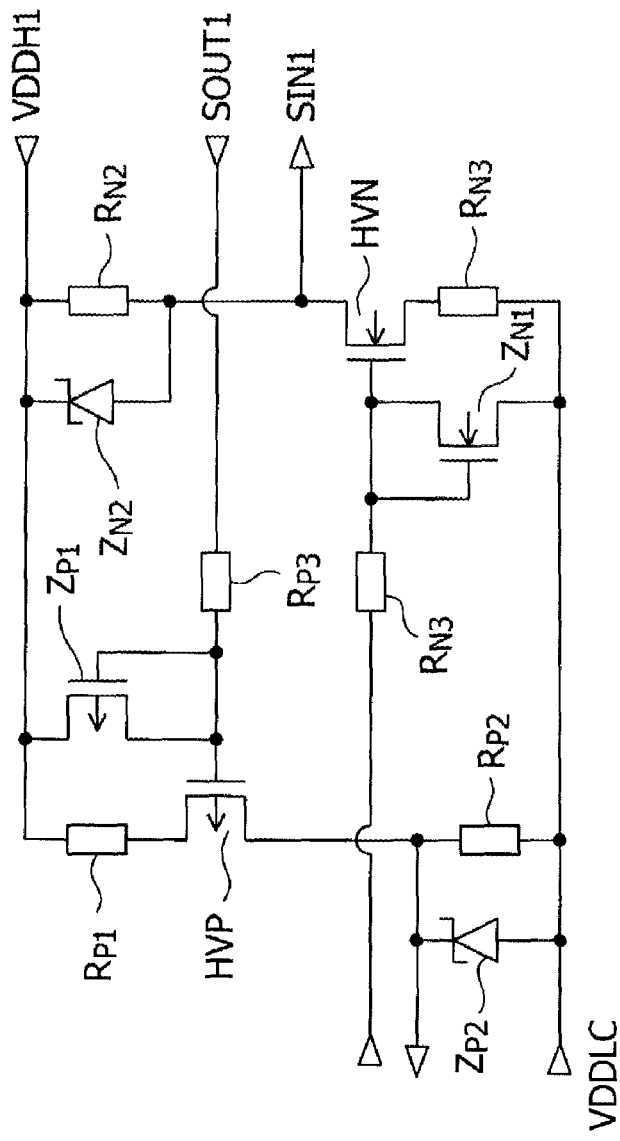
FIG. 4 is a circuit diagram showing a heretofore known example of a level shifter circuit.

Next, a description will be given of an action of the driver circuit according to the embodiment, referring to FIG. 3, which shows an outline of operation waveforms thereof.

When the level of the PWM signal VI changes from a high level (H level) to a low level (L level), the OR circuit OR1 outputs an H level signal (a turn-off signal) VH1, and the low side detection transistor M12 is turned on. At the timing at which the low side detection transistor M12 is turned on, the output signal of the OR circuit OR1, owing to a signal delay caused by the level shifter circuit LS, high side first stage drive circuit DRH is not transmitted to the high side output transistor M1 or high side detection transistor M11, because of which the two transistors M1 and M11 are still maintained in an on-state.

As a result of this, the high side detection transistor M11 and low side detection transistor M12 are both in an on-state, but as the resistor R is interposed between the drains of the two transistors, the drain of the high side detection transistor M11 is maintained at a high potential. Also, the resistor R suppresses shoot through current.

In the condition in which the drain of the high side detection transistor M11 is maintained at a high potential, the clamping circuit CL outputs an H level signal (e.g. VS2) clamped to the allowable voltage V3 of the low potential circuit. Consequently, the low side output transistor M2 is maintained in an off-state.

Next, when the H level signal output from the OR circuit OR1 is transmitted to the high side output transistor M1 and high side detection transistor M11 via the level shifter circuit LS and high side first stage drive circuit DRH, that is, when an output signal VH2 commanding a turning off is input from the level shifter circuit LS to the high side first stage drive circuit DRH, and a control signal (gate signal) VGH commanding a turning off is output from the high side first stage drive circuit DRH, the transistors M1 and M11 are both turned off. At this time, the drain potential of the high side output transistor M1 does not drop suddenly when a capacitive load is connected to the output terminal T. However, as the low side detection transistor M12 is in an on-state, a voltage VS1 of the drain of the high side detection transistor M11 drops immediately. Consequently, as the transistors M11 and M12 are both in an on-state only for the period for which the signal is delayed by the level shifter circuit LS and high side first stage drive circuit DRH, there is a shoot through state for only a very short time.

As the clamping circuit CL outputs an L level signal when the voltage VS1 of the drain of the high side detection transistor M11 drops, the OR circuit OR2 allows the PWM signal VI to pass through, and an H level signal VL (a turn-on signal) is output from the circuit OR2 and input into the low side first stage drive circuit DRL. As a result of this, after a delay time caused by the low side first stage drive circuit DRL, an H level control signal (gate signal) VGL is output from the low side first stage drive circuit DRL, and the low side output transistor M2 is turned on. The control signal VGL is also input into the OR circuit OR1, but this signal has no effect on the output of the OR circuit OR1.

As time from the high side output transistor M1 and high side detection transistor M11 being turned off until the low side output transistor M2 is turned on is dead time, this dead time is automatically set in the embodiment.

Subsequently, when the level of the PWM signal VI changes from the low level (L level) to the high level (H level), the low side detection transistor M12 is turned off, and an L level signal (a turn-off signal) VL is output from the OR circuit OR2. The signal VL output from the OR circuit OR2, owing to a delay caused by the low side first stage drive circuit DRL, is not immediately transmitted to the low side output transistor M2, because of which the low side output transistor M2 is still maintained in an on-state.

Meanwhile, while the low side output transistor M2 is maintained in the on-state, that is, while the control signal (gate signal) VGL is maintained at the H level, the OR circuit OR1 continues to output the H level signal VH1. Consequently, the high side output transistor M1 and high side detection transistor M11 are still maintained in an off-state.

Next, when an L level control signal VGL is output from the low side first stage drive circuit DRL based on the L level signal (turn-off signal) VL output from the OR circuit OR2, the low side output transistor M2 is turned off.

Meanwhile, the L level control signal VGL is fed back to the OR circuit OR1, as a result of which an L level signal (a turn-on signal) VH1 is output from the OR circuit OR1. That is, when a signal causing the low side output transistor M2 to be turned off is output from the low side first stage drive circuit DRL, the OR circuit OR1 allows the PWM signal VI to pass through.

The level shifter circuit LS outputs an L level signal VH2 based on the signal VH1, after which, the high side first stage drive circuit DRH outputs an L level control signal (gate signal) VGH, because of which the high side output transistor M1 and high side detection transistor M11 are both turned on.

The point at which the high side output transistor M1 and high side detection transistor M11 are turned on is delayed beyond the point at which the low side output transistor M2 is turned off owing to a signal delay caused by the level shifter circuit LS and high side first stage drive circuit DRH, and this delay time is dead time. This dead time is also automatically set in the embodiment.

Thus, the high side output transistor M1 and low side output transistor M2 are turned on and off in a complementary way based on the PWM signal VI, because of which, a drive signal for turning on and off an unshown power semiconductor device is output from the output terminal T.

As is clear from the above description, the H level control signal VGH input into the gate of the high side output transistor M1 is fed back via the high side detection transistor M11 and clamping circuit CL as a signal for causing the low side output transistor M2 to be turned on, and the L level control signal VGL input into the gate of the low side output transistor M2 is fed back via the OR circuit OR1, level shifter circuit LS, and high side first stage drive circuit DRH as a signal for causing the high side output transistor M1 and high side detection transistor M11 to be turned on.

As a result of this, as dead time is automatically optimally set in accordance with the operating state, as heretofore described, there is no need to provide a dead time circuit in a stage before the high side first stage drive circuit DRH and low side first stage drive circuit DRL. Also, as there is no need to employ the kind of complicated circuit configuration that shifts the gate voltage of the high side output transistor M1 to a level appropriate to the low side in order to detect a turning off of the high side output transistor M1, it is possible to achieve a simplification of the configuration.

Also, when the load connected to the output terminal T is a capacitive load, there is concern that the on/off-state of the high side output transistor M1 cannot be determined even when monitoring the voltage of the output terminal T, but as the high side detection transistor M11, which is not affected by the capacitive load, is provided in the embodiment, the on/off-state of the high side output transistor M1 is reliably determined from the drain voltage of the high side detection transistor M11.

In addition to the heretofore described advantages, the driver circuit according to the embodiment also has the following kinds of advantages.

A: In the on-period of the high side output transistor M1, as is clear from the above description and FIG. 3, the low side detection transistor M12 is in an on-state only for a period far shorter than the on-period of the high side output transistor M1.

This means that the time for which current (current based on the high output voltage V1 of the main power source EM) circulates in the series circuit including the high side detection transistor M11, resistor R, and low side detection transistor M12 is short, and furthermore, shoot through current is suppressed by the resistor R. Because of this, power loss in the on-period of the high side output transistor M1 is reduced.

B: Even in the event that the control voltage VGH momentarily changes to the H level due to noise, or the like, in the on-period of the high side output transistor M1, there is no malfunction (turning on) of the low side output transistor M2. This is because, in the on-period of the high side output transistor M1, the H level PWM signal VI is input into the OR circuit OR2, and the control signal VGL is at the L level.

The invention, not being limited to the heretofore described embodiment, includes various modifications. For example, it is also possible to use an NPN-type bipolar transistor in place of the n-channel transistor M3 in the clamping circuit CL shown in FIG. 2.

Also, the high side output transistor M1 and high side detection transistor M11 may be n-channel MOSFETs. In this case, it is sufficient to review the polarity of each logic circuit, and to supply a separate power source to the high side first stage drive circuit DRH.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A driver circuit comprising a serially connected high side output transistor and low side output transistor each driven on and off based on a control input pulse signal, and outputting a signal driving a power semiconductor device from a series connection point of the transistors, the driver circuit further comprising:
   a high side first stage drive circuit, into which a first on/off signal is input, that outputs a first control signal on/off driving the high side output transistor;
   a low side first stage drive circuit, into which a second on/off signal is input, that outputs a second control signal on/off driving the low side output transistor;
   a detector circuit, connected in parallel to the series circuit of the high side output transistor and low side output transistor, that includes a high side detection transistor, a resistor, and a low side detection transistor connected in series;
   a clamping circuit that converts a high voltage amplitude change signal generated at a connection point of the high side detection transistor and resistor in the detector circuit to a signal clamped to a voltage range applied on the low side;
   a first logic circuit that allows the control input pulse signal to pass through when the second control signal is a signal causing the low side output transistor to be turned off;
   a level shifter circuit that shifts the level of an output signal of the first logic circuit, and outputs the signal as the first on/off signal; and
   a second logic circuit that allows the control input pulse signal to pass through when an output signal of the clamping circuit is at an L level, outputting the control input pulse signal as a second on/off signal, wherein
   the high side detection transistor is driven on and off simultaneously with the high side output transistor by the first control signal, and
   the low side detection transistor is turned on when the control input pulse signal is a signal commanding a turning on of the low side output transistor or a signal commanding a turning off of the high side output transistor, and the low side detection transistor is turned off when the control input pulse signal is a signal commanding a turning off of the low side output transistor or a signal commanding a turning on of the high side output transistor.

2. The driver circuit according to claim 1, wherein p-channel MOSFETs are used as the high side output transistor and high side detection transistor, and n-channel MOSFETs are used as the low side output transistor and low side detection transistor.

3. The driver circuit according to claim 2, wherein
the first logic circuit is a logical sum circuit that outputs a logical sum signal of an inverse signal of the control input pulse signal and the second control signal, and
the second logic circuit is a logical sum circuit that outputs an inverse signal of a logical sum of the control input pulse signal and the clamping circuit output signal.

4. The driver circuit according to claim 3, wherein the control input pulse signal is a PWM signal.

5. The driver circuit according to claim 2, wherein the control input pulse signal is a PWM signal.

6. The driver circuit according to claim 1, wherein the control input pulse signal is a PWM signal.

7. An apparatus comprising:
a first switching device and a second switching device configured to be switched on and off to output a drive signal;
a first logic circuit configured to, in response to an input driving signal, output a first control signal to turn the first switching device on and off; and
a second logic circuit configured to, in response to the input driving signal and a clamping signal clamped to a predetermined voltage level, output a second control signal to turn the second switching device on and off complementarily to the first switching device; wherein
the first logic circuit has, as inputs, the input driving signal and the second control signal.

8. The apparatus of claim 7, further comprising:
a clamping device configured to output the clamping signal; and
a third switching device coupled to a terminal of the first switching device and an input of the clamping device.

9. The apparatus of claim 8, further comprising:
a resistor having a terminal coupled to the input of the clamping device; and
a fourth switching device coupled to another terminal of the resistor and a terminal of the second switching device.

10. The apparatus of claim 9, wherein:
the first switching device and the second switching device are connected in series;
the third switching device, the resistor and the fourth switching device are connected in series; and
the third switching device, the resistor and the fourth switching device are connected in parallel to the first switching device and the second switching device.

11. The apparatus of claim 7,
wherein the second logic circuit has, as inputs, the input driving signal and the clamping signal.

12. The apparatus of claim 11, wherein the first logic circuit includes an OR gate and the input driving signal is coupled to an inverting input of the OR gate.

13. The apparatus of claim 12, wherein the second logic circuit includes an OR gate with an inverting output.

14. The apparatus of claim 13, further comprising a level shifter device coupled between an output of the first logic circuit and the first switching device.

* * * * *